(12) United States Patent
Shinmaru et al.

(10) Patent No.: US 7,378,348 B2
(45) Date of Patent: May 27, 2008

(54) POLISHING COMPOUND FOR INSULATING FILM FOR SEMICONDUCTOR INTEGRATED CIRCUIT AND METHOD FOR PRODUCING SEMICONDUCTOR INTEGRATED CIRCUIT

(75) Inventors: Sachie Shinmaru, Kanagawa (JP); Hiroyuki Kamiya, Kanagawa (JP); Atsushi Hayashi, Kanagawa (JP); Katsuyuki Tsugita, Kanagawa (JP)

(73) Assignees: Asahi Glass Company, Limited, Tokyo (JP); Seimi Chemical Co., Ltd., Chigasaki-shi (JP)

( * ) Notice: Subject to any disclaimer, the term of this patent is extended or adjusted under 35 U.S.C. 154(b) by 245 days.

(21) Appl. No.: 11/071,182

(22) Filed: Mar. 4, 2005

(65) Prior Publication Data

US 2005/0202670 A1 Sep. 15, 2005

Related U.S. Application Data

(63) Continuation of application No. PCT/JP03/11368, filed on Sep. 5, 2003.

(30) Foreign Application Priority Data

Sep. 6, 2002 (JP) .............................. 2002-261964
Sep. 6, 2002 (JP) .............................. 2002-261965

(51) Int. Cl.
*H01L 21/302* (2006.01)
(52) U.S. Cl. ....................... 438/692; 438/626; 252/79.1
(58) Field of Classification Search ................ 438/692
See application file for complete search history.

(56) References Cited

U.S. PATENT DOCUMENTS

| 4,769,073 | A | | 9/1988 | Tastu et al. ..................... 106/3 |
|---|---|---|---|---|
| 5,445,996 | A | * | 8/1995 | Kodera et al. .............. 438/633 |
| 6,110,396 | A | | 8/2000 | Ronay .......................... 216/88 |
| 6,174,454 | B1 | | 1/2001 | Tsai et al. .................. 252/79.4 |
| 6,893,476 | B2 | * | 5/2005 | Siddiqui et al. .............. 51/307 |
| 2003/0109202 | A1 | * | 6/2003 | Matsuno et al. .............. 451/41 |
| 2003/0228762 | A1 | * | 12/2003 | Moeggenborg et al. ..... 438/691 |
| 2004/0139764 | A1 | * | 7/2004 | Komiya et al. ................ 65/61 |

FOREIGN PATENT DOCUMENTS

| EP | 0 822 164 A2 | 2/1998 |
|---|---|---|
| EP | 1 219 568 A2 | 7/2002 |
| JP | 6-216096 | 8/1994 |
| JP | 10-94955 | 4/1998 |
| JP | 2000-79564 | 3/2000 |

(Continued)

OTHER PUBLICATIONS

U.S. Appl. No. 11/071,182, filed Mar. 4, 2005, Shinmaru et al.
U.S. Appl. No. 11/088,788, filed Mar. 25, 2005, Kamiya et al.

*Primary Examiner*—Carl Whitehead, Jr.
*Assistant Examiner*—Colleen E. Rodgers
(74) *Attorney, Agent, or Firm*—Oblon, Spivak, McClelland, Maier & Neustadt, P.C.

(57) ABSTRACT

An insulating film comprising an organic silicon material having a C—Si bond and a Si—O bond is used for a semiconductor integrated circuit, and for polishing of its surface, a polishing compound comprising water and particles of at least one specific rare earth compound selected from the group consisting of a rare earth oxide, a rare earth fluoride, a rare earth oxyfluoride, a rare earth oxide except cerium oxide and a composite compound thereof, or a polishing compound having the above composition and further containing cerium oxide particles, is used. It is possible to provide a high quality polished surface which is free from or has reduced defects such as cracks, scratches or film peeling.

14 Claims, 5 Drawing Sheets

FOREIGN PATENT DOCUMENTS

| | | |
|---|---|---|
| JP | 2000-286255 | 10/2000 |
| JP | 2000-303060 | 10/2000 |
| JP | 2000-336344 | 12/2000 |
| JP | 2002-194334 | 7/2002 |

* cited by examiner

POLISHING COMPOUND FOR INSULATING FILM FOR SEMICONDUCTOR INTEGRATED CIRCUIT AND METHOD FOR PRODUCING SEMICONDUCTOR INTEGRATED CIRCUIT

TECHNICAL FIELD

The present invention relates to a polishing technique to be utilized for polishing for planarization of an insulating film comprising an organic silicon material having a C—Si bond and a Si—O bond, to be used for shallow trench isolation (STI) or interlayer insulation, particularly for the latter, in a semiconductor integrated circuit, and a method for producing a semiconductor integrated circuit, which has a step of polishing an insulating film comprising an organic silicon material having a C—Si bond and Si—O bond.

BACKGROUND ART

In recent years, low power and high speed are required for semiconductor integrator circuits, and drastic increase in density and high densification are required, and multilayered structures of circuits and miniaturization of wiring patters by e.g. copper or aluminum are in progress.

With respect to the multilayered structures of circuits, the irregularities on the surface of a circuit formed by e.g. exposure, has an influence over a circuit to be formed thereon in a multilayered structure. This influence tends to be significant in the wiring pattern at the upper layer, and makes it difficult to satisfy both resolution and depth of focus in photolithography, or causes a defect such as breakage of wire of the circuit.

Accordingly, an insulating film formed on a semiconductor substrate is planarized by chemical mechanical polishing (CMP), and a new wiring is optically exposed by photolithography to form a circuit thereon, and such an operation is repeatedly carried out to laminate circuits.

In this CMP, the irregularities on the surface to be polished have to be flattened by polishing in as short time as possible and at the same time, defects on the semiconductor substrate surface at the time of polishing, such as cracks, scratches or film peeling, which cause the irregularities on the surface to be polished, have to be suppressed as far as possible.

On the other hand, by miniaturization of processing line width by miniaturization of the wiring pattern by using e.g. copper or aluminum, due to narrowed space between wirings, the capacitance between wirings tends to increase, the signal delay time tends to be long, and the increase in speed of a semiconductor integrated circuit will be inhibited. Thus, insulation between wirings is carried out by tightly filling e.g. the space between such miniaturized wirings with a material having a low dielectric constant.

Heretofore, as a material of an insulating film, inorganic material such as a $SiO_2$ film having a relative dielectric constant of about 4.2 has been used (e.g. JP-A-06-216096 (paragraphs 0172, 0173), JP-A-10-94955 (paragraph 0028), JP-A-2000-79564 (paragraph 0011)). However, in recent years, due to further increase in density of wirings, an insulating film having a dielectric constant lower than ever is required.

Such an insulating film, an organic silicon material film having a C—Si bond and a Si—O bond is proposed. Such an organic silicon material film having an C—Si bond and a Si—O bond can not be said to have high mechanical strength as compared with a conventional $SiO_2$ film, however, it generally has a low dielectric constant, comparable in thermal stability and has characteristics exceeding a conventional $SiO_2$ film in many points such as a property to form a flat surface at the time of film formation, and a characteristic to fill the gap at the time of film formation.

When such an organic silicon material having a C—Si bond and a Si—O bond, which is used as an insulating film for example, is polished with a conventional polishing compound comprising particles of e.g. silica, alumina or ceria as abrasive grains and water as a main medium, if polishing is carried out under the same pressure ($2.8 \times 10^4$ to $3.4 \times 10^4$ Pa) as in a case of polishing a conventional insulating film made of an inorganic material so as to obtain a high polishing speed (polishing rate), defects such as cracks, scratches or film peeling, which may cause the irregularities on the organic silicon material film having a C—Si bond and a Si—O bond in some cases. This is considered to be a phenomenon resulting from low mechanical strength of the organic silicon material film having a C—Si bond and a Si—O bond as compared with an inorganic material insulating film. Further, if the pressure during polishing is decreased to prevent such defects, no adequate polishing speed could be obtained.

Further, in the case of ceria which is used as widely as silica as abrasive grains for a conventional $SiO_2$ film, the polishing speed was found to significantly decrease when used for polishing the organic silicon material film having a C—Si bond and a Si—O bond.

As mentioned above, an appropriate polishing compound has not been found for an insulating film comprising an organic silicon material having a C—Si bond and a Si—O bond, which is a bottleneck in effective production of a multilayered semiconductor integrated circuit.

DISCLOSURE OF THE INVENTION

It is an object of the present invention to overcome the above problems and to provide a novel polishing technique which effectively planarizes an insulating film comprising an organic silicon material having a C—Si bond and a Si—O bond, formed on a semiconductor integrated circuit, and which provides a high quality polished surface which is free from defects such as cracks, scratches or film peeling, in a process for producing a semiconductor integrated circuit.

Further, it is an object of the present invention to produce a semiconductor integrated circuit with an insulating film having a low dielectric constant and excellent in surface flatness, with high yield with good productivity, utilizing the above technique.

According to one embodiment of the present invention, a polishing compound for polishing an insulating film comprising an organic silicon material having a C—Si bond and a Si—O bond, to be used for a semiconductor integrated circuit, which contains water and particles of at least one specific rare earth compound selected from the group consisting of a rare earth hydroxide, a rare earth fluoride, a rare earth oxyfluoride, a rare earth oxide except cerium oxide, and a composite compound thereof, is provided.

It is preferred that the polishing compound further contains cerium oxide particles; the mass ratio of cerium oxide to the specific rare earth compound as calculated as oxide is within a range of from 99:1 to 1:99; and the specific rare earth compound is at least one rare earth compound selected from the group consisting of $La_2O_3$, $La(OH)_3$, $Nd_2O_3$, $Nd(OH)_3$, $Pr_6O_{11}$, $Pr(OH)_3$, CeLaO and $CeLa_2O_3F_3$.

The polishing compound according to the present invention makes it possible to effectively planarize an insulating film comprising an organic silicon material having a C—Si bond and a Si—O bond, formed on a semiconductor integrated circuit, and to provide a high quality polished surface which is free from or has reduced defects such as cracks, scratches or film peeling, in a process for producing a semiconductor integrated circuit.

According to another embodiment of the present invention, a method for producing a semiconductor integrated circuit, which has a step of polishing an insulating film comprising an organic silicon material having a C—Si bond and a Si—O bond, with a polishing compound comprising water and particles of at least one specific rare earth compound selected from the group consisting of a rare earth hydroxide, a rare earth fluoride, a rare earth oxyfluoride, a rare earth oxide except cerium oxide, and a composite compound thereof, is provided.

It is preferred that the specific rare earth compound is at least one rare earth compound selected from the group consisting of $La_2O_3$, $La(OH)_3$, $Nd_2O_3$, $Nd(OH)_3$, $Pr_6O_{11}$, $Pr(OH)_3$, CeLaO and $CeLa_2O_3F_3$; a polishing compound further contains cerium oxide particles; the organic silicon material having a C—Si bond and a Si—O bond has a Si—CH$_3$ bond, has a relative dielectric constant within a range of from 1.0 to 3.5, and has an atomic ratio of C to Si within a range of from 0.25 to 3; the insulating film is covered with a copper wiring layer; and the mass ratio of the cerium oxide to the specific rare earth compound as calculated as oxide is within a range of from 99:1 to 1:99.

The method of producing a semiconductor integrated circuit according to the present invention makes it possible to produce a semiconductor integrated circuit with an insulating film having a low dielectric constant and excellent in surface flatness, with high yield with good productivity.

The other objects and advantages of the present invention are clear from the following explanation.

BEST MODE FOR CARRYING OUT THE INVENTION

Figure 1:
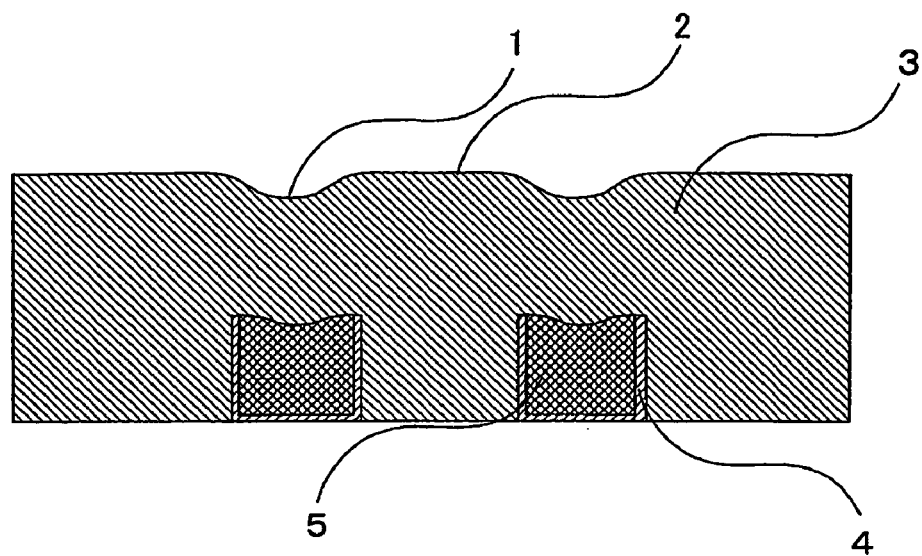
FIG. 1 is a cross-sectional model view illustrating an interlayer insulating film before polishing.

Now, the present invention will be explained with reference to Figs., Tables, Examples, etc. Such Figs., Tables, Examples, etc. and explanation are to exemplify the present invention, and they do not restrict the present invention. Needless to say, another embodiment is included in the present invention so long as it fulfills the object of the present invention. In Figs., the same symbols are attached to the same elements.

As an insulating film material to be used for a semiconductor integrated circuit, a SiO$_2$ film having a relative dielectric constant of about 4.2 has been widely used, and along with the need for low dielectric constant, a compound containing a Si—H bond in SiO$_2$ (hydrogen-containing polysiloxane: HSQ, hydrogen silses quioxane) and an organic silicon material having a C—Si bond and a Si—O bond have been developed. The latter is one of organic/inorganic composite materials.

As an organic silicon material having a C—Si bond and a Si—O bond, attention is drawn especially to a compound having a Si—CH$_3$ bond. This compound is called carbon-containing SiO$_2$ film (SiOC) when produced by plasma CVD (chemical vapor deposition), and is sometimes called MSQ (methyl silses quioxane) when produced by a coating method such as SOG (spin on glass).

HSQ has a relative dielectric constant (hereinafter sometimes referred to as k value) at a level of 3.0, whereas SiOC has a k value of so low as from 2.5 to 2.8 and is comparable to an organic insulating film of e.g. a polyimide, and further, it is excellent in mechanical characteristics such as heat resistant as characteristics of an organic/inorganic composite material, and accordingly it attracts attention.

Specifically, an insulating film material comprising an organic silicon material having a C—Si bond and a Si—O bond may, for example, be Black Diamond, tradename (relative dielectric constant: 2.7, technology by Applied Materials, Inc.), Coral, tradename, (relative dielectric constant 2.7, technology by Novellus Systems) or Aurora 2.7 (relative dielectric constant 2.7, technology by ASM Japan K. K.).

The polishing compound according to the present invention is to be used for polishing an insulating film of a semiconductor made by using such an organic silicon material having a C—Si bond and a Si—O bond. Hereinafter "the polishing compound according to the present invention" will be referred to as "the present polishing compound", and "the organic silicon material having a C—Si bond and a Si—O bond according to the present invention" will be referred to as "the present organic silicon material" in some cases.

The present organic silicon material is not particularly limited, however, a film formed by CVD as represented by the above SiOC is used as an object to be polished, preferred effects will be obtained. A compound having a Si—CH$_3$ bond is particularly preferred.

The insulating film used for a semiconductor integrated circuit, to be an object of the present invention, may be one for any purpose such as one for interlayer insulation or for STI formation, and is not particularly limited so long as it is against the purpose of the present invention. However, the present invention is preferably applied to an insulating layer to be used for the purpose of interlayer insulation, because a flat polished surface which is free from or has reduced defects such as cracks, scratches or film peeling can be obtained in a short time. Now, explanation will be made with reference to mainly an interlayer insulating film.

Figure 2:
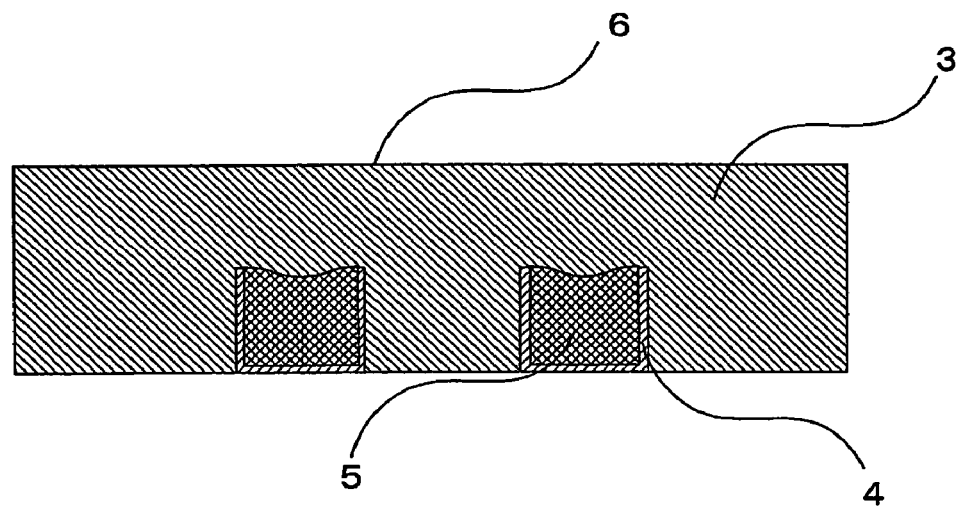
FIG. 2 is a cross-sectional model view illustrating an interlayer insulating film after polishing.

FIGS. 1 and 2 illustrate the state of polishing of an interlayer insulating film. FIG. 1 is a partial cross-sectional view illustrating a semiconductor integrated circuit during a production process, wherein a barrier layer 4, a wiring pattern 5 and an interlayer insulating film 3 before polishing are laminated in this order.

The difference between the concave portion 1 and the convex portion 2 in the cross section of the interlayer insulating film 3 occurs whether or not a wiring pattern is present thereunder. In the case of FIG. 1, which illustrates a wiring pattern by a damascene method, the portion corresponding to the wiring pattern 5 is concave, however, in the case of another method, the portion corresponding to the wiring pattern 5 may be convex in some cases. The surface of the interlayer insulating film 3 is polished to eliminate the difference between the concave portion 1 and the convex portion 2, to realize a planarized polished surface 6 as shown in FIG. 2. Such a layer is laminated to prepare a semiconductor integrated circuit. FIGS. 1 and 2 illustrate an example, and the present invention can be applied to an optional case such as a case of using a copper wiring or an aluminum wiring.

The present polishing compound is a composition comprising water and particles of a rare earth compound except cerium oxide as abrasive grains, as essential components. The proportion of the rare earth compound except cerium oxide in the abrasive grains contained in the present polishing compound is preferably higher than 99 mass %.

The rare earth compound except cerium oxide is preferably at least one specific rare earth compound selected from the group consisting of a rare earth hydroxide, a rare earth fluoride, a rare earth oxyfluoride, a rare earth oxide except cerium oxide and a composite compound thereof.

In the present invention, a composite compound means a compound formed by combination of at least two compounds, and oxygen acid ions may be present in its structure. It may, for example, be a composite oxide formed by combination of at least two oxides or a composite oxyfluoride formed by combination of an oxide and a fluoride. CeLaO and $CeLa_2O_3F_3$ may be mentioned as specific examples of the former and the latter, respectively.

The polishing compound containing water and particles of a specific rare earth compound was found to be suitable for polishing the above insulating film, to realize a high polishing speed, to suppress defects such as cracks, scratches or film peeling on the polished surface at the time of planarization, and to provide an excellent semiconductor multilayered integrated circuit. This is unexpected from such a conventional fact that the polishing speed is decreased when a polishing compound containing a cerium oxide having lowered purity of cerium oxide is applied to a $SiO_2$ film, and only a low polishing speed is obtained when the polishing compound containing a cerium oxide is applied to an organic polymer insulating film.

Now, the specific rare earth compound in the present invention will be specifically explained below. Abrasive grains of a rare earth oxide except cerium oxide may be prepared, for example, by oxidizing at least one of a hydroxide, an oxyhydroxide, a carbonate, a nitrate, a sulfate, an oxalate and a composite salt thereof, or a carbonate of a composite rare earth, or a mixture of a carbonate of a composite rare earth and the above material, by firing or with e.g. hydrogen peroxide. The firing temperature is usually from 600 to 900° C. Oxide particles immediately after produced by such a method are agglomerated and thus preferably ground mechanically. The grinding method is preferably dry grinding by e.g. a jet mill or a wet grinding method by e.g. a planetary bead mill. A collision grinding treatment is also possible. As a method of dispersing the obtained oxide particles into water, in addition to a dispersion treatment with a conventional stirring machine, a homogenizer, an ultrasonic dispersing machine, a wet ball mill, etc. may be used. As the dispersion treatment, dispersion by instantly releasing the pressure from a pressurized state of several MPa, may also be employed.

It is important that the purity of the specific rare earth compound does not fluctuate. If the purity fluctuates, the polishing speed fluctuates, and the fluctuation may cause severe defects in polishing of an insulating film, in which polishing is terminated after a predetermined polishing time in many cases. The purity is preferably at least 98 mass %.

In the present invention, the specific rare earth compound includes a cerium compound except cerium oxide.

The specific rare earth compound is, specifically, preferably at least one rare earth compound selected from the group consisting of $La_2O_3$, $La(OH)_3$, $Nd_2O_3$, $Nd(OH)_3$, $Pr_6O_{11}$, $Pr(OH)_3$, CeLaO and $CeLa_2O_3F_3$. It is more preferably $La_2O_3$, $Nd_2O_3$, $CeLa_2O_3F_3$ or a mixture thereof, which is easily available, which is stable in quality and which provides results with good reproducibility.

In a case where the specific rare earth compound is an oxide, particularly $La_2O_3$, $Nd_2O_3$ or $Pr_6O_{11}$, part or the whole thereof may form a hydroxide such as $La(OH)_3$, $Nd(OH)_3$ or $Pr(OH)_3$ with water as a medium, however, such a change of the rare earth compound in water will not impair the effects of the present invention.

Further, the concentration in the polishing compound is preferably within a range of from 0.1 to 10 mass %, particularly preferably from 0.5 to 5 mass %. If the content of the abrasive grains is lower than 0.1 mass %, no desired polishing speed will be obtained, and on the other hand, if it exceeds 10 mass %, the polishing speed will not increase any more, and defects such as cracks, scratches or film peeling may occur, and such a high content is not favorable in many cases.

Further, a polishing compound wherein cerium oxide particles as abrasive grains coexist as an essential component was also found to be suitable for polishing the above insulating film, to realize a high polishing speed, to suppress defects such as cracks, scratches or film peeling on the polished surface at the time of planarization, and to provide an excellent semiconductor multilayered integrated circuit.

This is also unexpected from a conventional fact that the polishing speed is decreased when a polishing compound containing a cerium oxide having lowered purity of cerium oxide is applied to a $SiO_2$ film, and only a low polishing speed is obtained when the polishing compound containing a cerium oxide is applied to an organic polymer insulating film.

Namely, a polishing compound for polishing an insulating film comprising an organic silicon material having a C—Si bond and a Si—O bond, to be used for a semiconductor integrated circuit, which comprises water, cerium oxide particles, and particles of a rare earth compound except cerium oxide, is also included in the present polishing compound. In the present invention, "rare earth compound except cerium oxide" includes a cerium compound except cerium oxide.

The cerium oxide particles in the present invention may be prepared, in the same manner as the abrasive grains of a rare earth oxide except cerium oxide, for example, by oxidizing a salt such as a hydroxide, an oxyhydroxide, a carbonate, a nitrate, a sulfate or an oxalate by firing or with e.g. hydrogen peroxide. The firing temperature is usually from 600 to 900° C. The oxide particles immediately after produced by such a method are agglomerated and thus preferably ground mechanically. The grinding method is preferably dry grinding by e.g. a jet mill or a wet grinding method by e.g. a planetary bead mill. A collision grinding treatment is also possible. As a method of dispersing the obtained oxide particles into water, in addition to a dispersion treatment by a conventional stirring machine, a homogenizer, an ultrasonic dispersing machine, a wet ball mill, etc. may be used. As the dispersion treatment, dispersion by instantly releasing the pressure from a pressurized state of several MPa may also be employed.

As the rare earth compound except cerium oxide, it is preferred to use at least one specific rare earth compound selected from the group consisting of a rare earth oxide, a rare earth hydroxide, a rare earth fluoride and a rare earth oxyfluoride. The specific rare earth compound is as defined above.

In a case where the specific rare earth compound is an oxide, one which is present in the cerium oxide as an impurity is also included, however, it is important that the proportion to the cerium oxide does not fluctuate. If the proportion to the cerium oxide fluctuates, the polishing speed fluctuates, and the fluctuation may cause severe defects in polishing of an insulating film, in which polishing is terminated after a predetermined polishing time in many cases. The purity of the cerium oxide and the specific rare earth compound is preferably at least 98 mass %.

The mass ratio of the cerium oxide to the specific rare earth compound as calculated as oxide is preferably within a range of from 99:1 to 1:99.

By blending the cerium oxide with the specific rare earth compound, polishing at a higher polishing speed than polishing with the specific rare earth compound alone becomes possible. However, if the concentration of the cerium oxide is too high, the polishing speed tends to decrease, and if the concentration of the cerium oxide is too low, the polishing speed will not be higher than the polishing speed in polishing with the specific speed earth compound alone. The mass ratio is more preferably from 99:1 to 10:90, furthermore preferably from 90:10 to 15:85.

Further, the mean particle size (mean particle diameter) of the cerium oxide particles and the specific rare earth compound particles as abrasive grains is preferably within a range of from 0.01 to 1 µm, more preferably within a range of from 0.05 to 0.5 µm. If the mean particle size of the abrasive grains is smaller than 0.01 µm, no desired polishing speed will be obtained, and if it is larger than 1 µm, there is a high possibility of defects such as cracks, scratches or film peeling. For measurement of the mean particle size, as mentioned above, a laser diffraction/scattering type, dynamic light scattering type or photon correlation type particle size analyzer may be used. For example, MICROTRAC HRA MODEL 9320-X100 manufactured by Nikkiso Co., Ltd. used in Examples is one of laser diffraction/scattering type particle size analyzers.

Further, the total amount of the cerium oxide particles and the specific rare earth compound particles as the abrasive grains is preferably within a range of from 0.1 to 10 mass % in the polishing compound, particularly preferably from 0.5 to 5 mass %. If the content of the abrasive grains is lower than 0.1 mass %, no desired polishing speed will be obtained, and on the other hand, if it exceeds 10 mass %, the polishing speed will not increase any more, and further, defects such as cracks, scratches or film peeling may occur, and such a high content is not favorable in many cases.

In the present invention, the cerium oxide means a tetravalent cerium oxide called ceria. It is described by a formula $CeO_2$ in many cases as a general name, but practically, in the structure of $CeO_{2-x}$, it is common that $x<0.26$. Compounds other than the above rare earth compound are also described by formulae as general names. In the above, "as calculated as oxide" means calculation as an oxide in accordance with such a general name.

In the present polishing compound comprising cerium oxide particles and a specific rare earth compound as abrasive grains, and in the polishing compound comprising a specific rare earth compound alone, water is suitable to stably disperse the abrasive grains so that the polishing compound is supplied to a polishing apparatus in a constant amount. Water may be any one so long as it does not impair the object of the present invention. Pure water or ion-exchanged water may, for example, be used. The proportion of the water to the cerium oxide particles and the specific rare earth compound particles may optionally be determined depending upon actual conditions such as handling of the composition. For example, the cerium oxide particles and the specific rare earth compound particles are stored as a high concentration slurry, which is diluted with water when used for polishing, and the viscosity of the polishing compound is optionally selected depending upon the polishing environment of e.g. a polishing machine or a pad. The present polishing compound comprising cerium oxide particles and a specific rare earth compound as abrasive grains includes such use.

The present polishing compound may be prepared by a known method, for example, by introducing the specific rare earth compound, or the cerium oxide particles and the specific rare earth compound particles, into ion-exchanged water with stirring, followed by dispersion treatment by e.g. a homogenizer or an ultrasonic dispersing machine and filtration of foreign substances with a filter. Other additives may optionally be added during this preparation.

The present polishing compound, containing or not containing cerium oxide particles as abrasive grains, may optionally contain a pH adjustor, a surfactant, a chelating agent, an oxidizing agent, a reducing agent, a viscosity-imparting agent or a viscosity controlling agent, a coagulant, a dispersing agent, etc. as the case requires, within a range not to impair the object of the present invention.

The pH adjustor is not particularly limited, and a known acid or alkali may be used. For example, the pH adjustor to the basic side may be ammonia, an alkali metal compound such as sodium hydroxide or potassium hydroxide, a primary to tertiary amine, hydroxylamine or a quaternary ammonium salt such as tetramethylammonium hydroxide or tetraethylammonium hydroxide, or 2-amino-2-hydroxymethyl-1,3-propanediol. Further, the pH adjustor to the acid side may be an inorganic acid such as nitric acid, sulfuric acid or hydrochloric acid, or an organic acid such as acetic acid, propionic acid, lactic acid, citric acid, oxalic acid or succinic acid.

The surfactant is not particularly limited and is optionally selected from an anionic surfactant, a cationic surfactant, a nonionic surfactant and an ampholytic surfactant. The anionic surfactant may, for example, be ammonium lauryl sulfate, polyacrylic acid, an alkyl sulfate or an alkylbenzene sulfonate. The cationic surfactant may, for example, be an alkylamine salt or a quaternary ammonium salt. The nonionic surfactant may, for example, be a polyoxyethylene derivative, a polyoxyethylene sorbitan fatty acid ester or a glycerol fatty acid ester. The ampholytic surfactant may, for example, be an alkylbetaine or an amine oxide. The chelating agent is also not particularly limited, and a known one may be used. It may, for example, be tartaric acid, malonic acid, 2-amino-2-hydroxymethyl-1,3-propanediol, an amino acid such as glycine, alanine, glutamine or asparagine, a peptide such as glycylglycine or glycylalanine, a polyaminocarboxylic acid such as EDTA, an oxycarboxylic acid such as citric acid or condensed phosphoric acid. Further, anthranilic acid metal chelate or quinaldinic acid metal chelate, which forms a complex with a metal such as copper, may be used. The oxidizing agent is also not particularly limited, and known hydrogen peroxide, urea peroxide, peracetic acid, ferric nitrate or an iodate may, for example, be used. The reducing agent is also not particularly limited, and known one may be used. For example, a hydrogen compound such as hydrogen iodide or hydrogen sulfide, an aldehyde, sugars or an organic compound such as formic acid or oxalic acid may be used.

The organic silicon material having a C—Si bond and a Si—O bond, to be suitably polished in the present invention, preferably has an atomic ratio as the molar ratio of C to Si in its structure of preferably within a range of from 0.25 to 3, more preferably within a range of from 1 to 2.5.

The atomic ratio of C to Si has a close relationship with mechanical characteristics and the dielectric constant of the insulating film. In general, the higher the C content, i.e. the higher the atomic ratio of C to Si, the lower the dielectric constant, but the more the mechanical characteristics tend to decrease. The relative dielectric constant of the insulating film is preferably within a range of from 1.0 to 3.5, more preferably within a range of from 1.0 to 3.0.

Such an insulating film comprising an organic silicon material having a Si—C bond and a Si—O bond may be deposited on a semiconductor wafer by e.g. CVD.

At that time, there may be a concentration gradient in the C content by an operation of e.g. forming a layer having a high oxygen content in the insulating film. According to the present invention, its effect will not decrease even for an insulating film having such a concentration gradient, a high polishing rate can be obtained, and a semiconductor integrated circuit can be planarized.

The method of polishing an insulating film comprising the present organic silicon material by using the present polishing compound is not particularly limited. Such a method may be employed wherein the rear side of a semiconductor integrated circuit having an insulating film comprising the present organic silicon material formed on its surface, is fixed on a rotatable support, a polishing head equipped with a polishing pad is brought into contact with the surface of the semiconductor integrated circuit, and the polishing pad is rotated.

The semiconductor integrated circuit may be attached to the support by means of a cushioning material which absorbs the pressure during polishing and which applies a pressure uniformly to the semiconductor integrated circuit. Further, the polishing pad may have a feed orifice or channel so that the polishing slurry can be uniformly supplied to the surface of the semiconductor integrated circuit.

The material of the polishing pad may be a polyester or a polyurethane, and in Examples of the present invention, IC-1400 K-Grooved (polyurethane material, manufactured by Rodel Nitta) was employed, however, the polishing pad and its material to be used in the present invention are not limited thereto, and may optionally be selected depending upon the combination of the polishing compound, the polishing apparatus, etc. to be used.

The polishing pressure may optionally be set depending upon the relationship with the type of the polishing pad, the type of the cushioning material, the polishing speed and the characteristics of the polishing compound such as viscosity.

Specifically, in polishing of an insulating film comprising an organic silicon material having a C—Si bond and a Si—O bond, to which the present invention is applied, the polishing pressure is preferably within a range of from $0.7 \times 10^3$ to $2.5 \times 10^4$ Pa, more preferably within a range of from $1 \times 10^4$ to $1.7 \times 10^4$ Pa. If the polishing pressure is lower than $0.7 \times 10^3$ Pa, no adequate polishing rate will be obtained in many cases, and if it is higher than $2.5 \times 10^4$ Pa, scratches or the like are likely to occur in the process of polishing, and a circuit formed on a semiconductor substrate or a multilayered structure of circuits are impaired in many cases.

In the polishing method of the present invention, the supply amount of the polishing compound slurry is preferably from 0.02 to 0.3 mL/(min×cm$^2$), particularly preferably from 0.05 to 0.2 mL/(min×cm$^2$). If the supply amount is smaller than 0.02 mL/(min×cm$^2$), no adequate polishing rate may be obtained, and on the contrary, if it exceeds 0.3 mL/(min×cm$^2$), the amount of the slurry exceeds an amount required for polishing, such being uneconomical. "cm$^2$" means the surface area of the polishing pad.

The semiconductor integrated circuit polished by the polishing compound of the present invention is usually adequately washed with running water and dried, after polishing. Ultrasonic cleaning is carried out in many cases.

The semiconductor integrated circuit polished by using the polishing compound of the present invention, obtained as mentioned above, is particularly useful when it has a copper wiring layer covered with an insulating film in its structure. It is because a highly integrated wiring structure expected for copper wiring will readily be realized by the presence of an insulating layer having a low dielectric constant, free from defects such as cracks, scratches of film peeling, and excellent in surface flatness.

EXAMPLES

Now, the present invention will be explained more specifically with reference to Examples. Examples 1 to 3, 8 and 9 to 11 are Examples of the present invention, and Examples 4 to 7 and 12 to 15 are Comparative Examples. "%" means "mass %" unless otherwise specified. Materials and measurement methods used in Examples are as follows.

(Measurement of Mean Particle Size)

It was obtained by MICROTRAC HRA MODEL 9320-X100 manufactured by Nikkiso Co., Ltd.

(Interlayer Insulating Film)

An interlayer insulating film comprising an organic silicon material having a C—Si bond and a Si—O bond, used as an object to be studied in the present Examples, is a film of Black Diamond, tradename (relative dielectric constant: 2.7) based on a production method as specified by Applied Materials, Inc.

Figure 3:
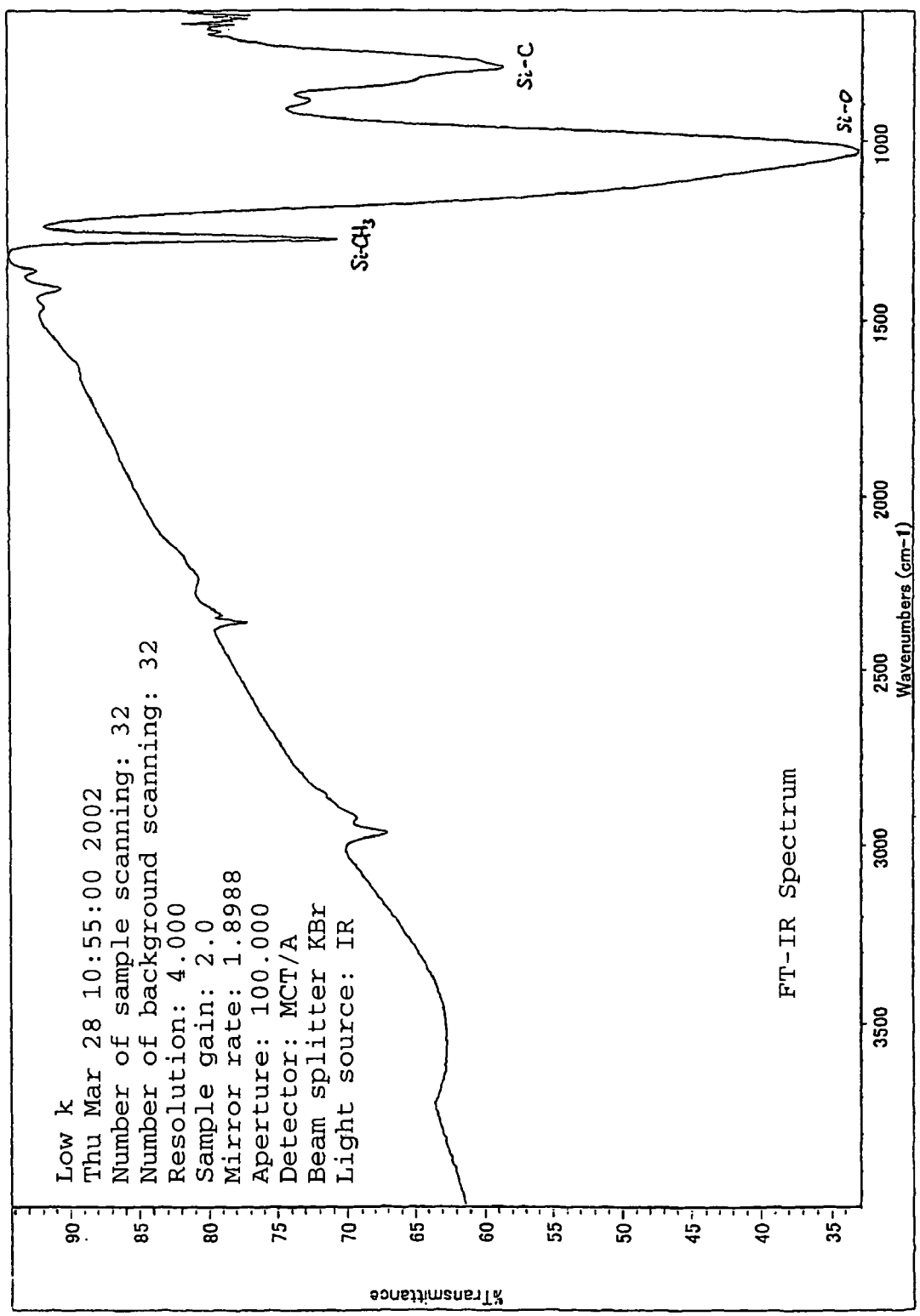
FIG. 3 is a FT-IR spectrum of a Black Diamond film.
Figure 6:
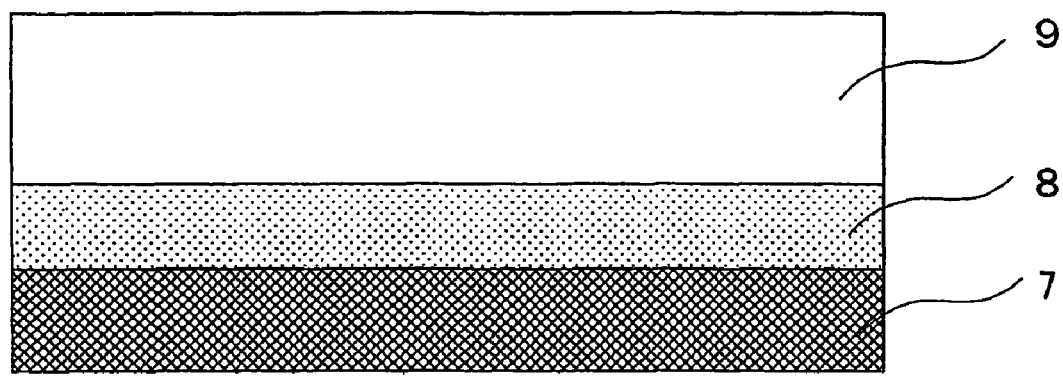
FIG. 6 is a cross-sectional model view illustrating a multilayered product with a Black Diamond film as an interlayer insulating film.

A multilayered product having this interlayer insulating film has such a structure that a SiO$_2$ film 8 with a thickness of 500 nm and a Black Diamond film 9 with a thickness of 500 nm are laminated on a silicon substrate 7, as shown in FIG. 6, and imitates a structure in which an interlayer insulating film is formed on a semiconductor integrated circuit. The result of measurement of an infrared spectrum with respect to the Black Diamond film by means of a FT-IR apparatus (model: FTIR-8300) manufactured by Shimadzu Corporation are shown in FIG. 3.

Figure 4:
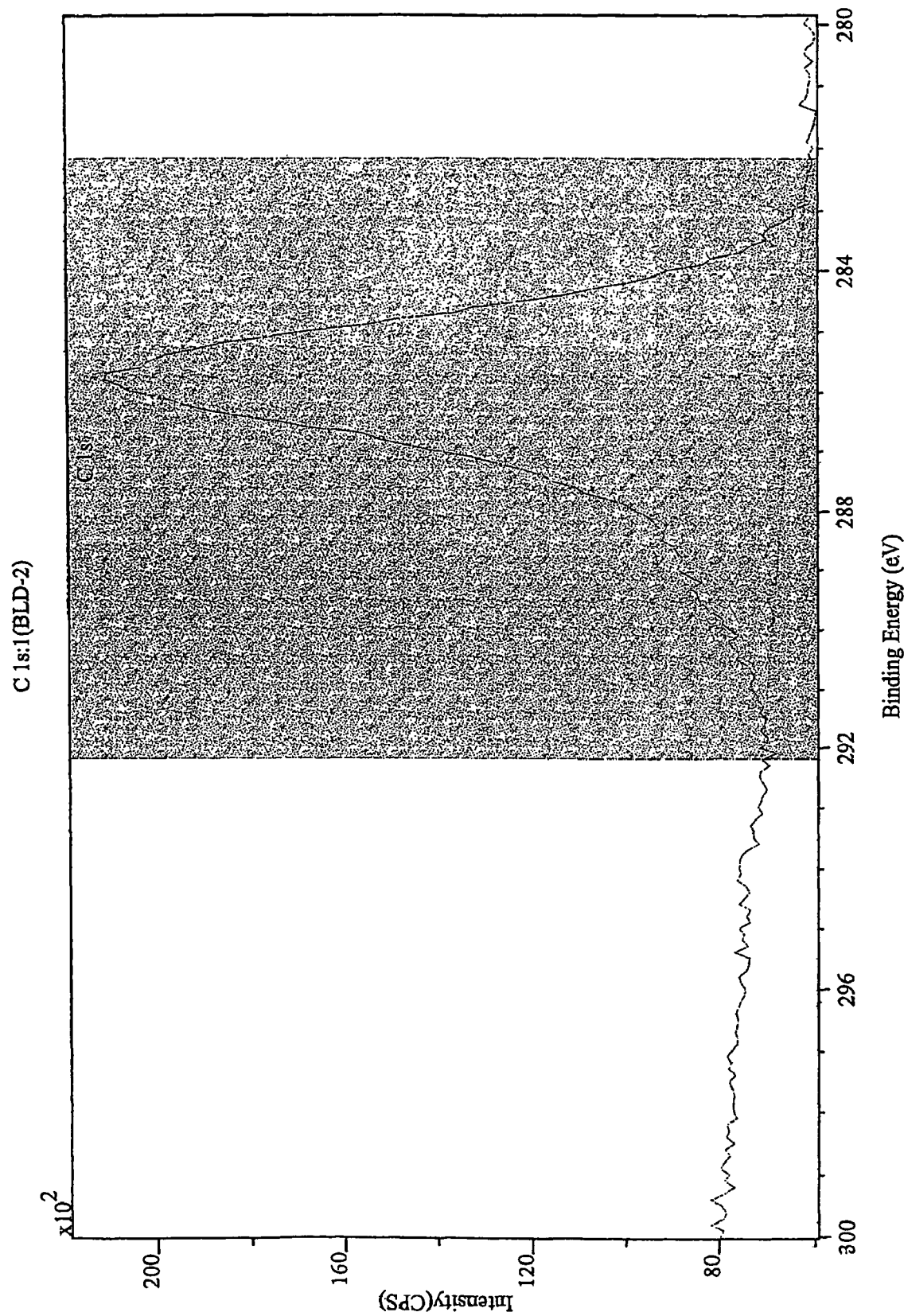
FIG. 4 illustrates a result of measurement of carbon contained in the Black Diamond film surface by X-ray photoelectron spectroscope.
Figure 5:
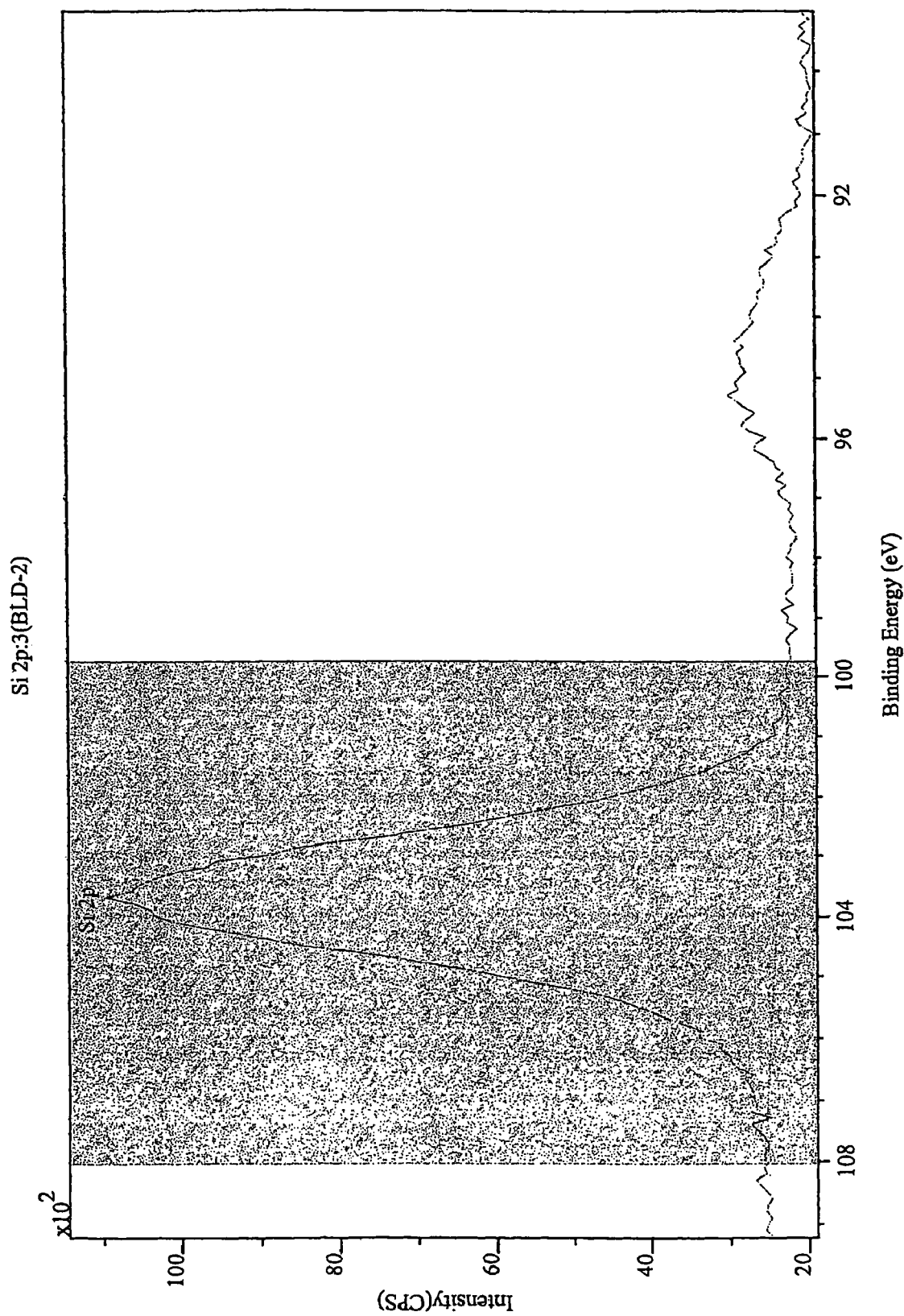
FIG. 5 illustrates a result of measurement of silicon contained in the Black Diamond film surface by X-ray photoelectron spectroscope.

From this infrared ray chart, the interlayer insulating film is found to have a Si—C bond, a Si—O bond and a Si—CH$_3$ bond. Further, with respect to the Black Diamond film, concentrations of C and Si per Ar sputtering time were measured by using an X-ray photoelectron spectroscopy (ESCA: electron spectroscopy for chemical analysis, model: ESCA-3400) manufactured by Shimadzu Corporation as shown in FIGS. 4 and 5, and the results are shown in Table 1 as counts (cps: count per second) of C and Si per Ar sputtering time and the atomic ratio of C to Si. A longer Ar sputtering time means closer to the bottom of the layer of the interlayer insulating film.

In FIGS. 4 and 5, 1$s$ and 2$p$ represent detection orbitals of the respective atoms, and the atomic ratio is represented based on values obtained by dividing the peak areas by the sensitivity factors of an apparatus for the respective atoms (C, 1.000, Si:0.870).

As shown in Table 1, it is understood that in the interlayer insulating film, there is such a concentration gradient that the carbon content is higher at the lower part of the layer.

(Abrasive Grains)

(Cerium Oxide Particles)

High purity cerium carbonate was subjected to wet grinding and then heated at a slurry temperature of 100° C. under reflux with stirring by using a reactor, and aged until formation of carbon dioxide gas stopped, and then dried. The obtained product was fired at 700° C. by using a gas furnace and ground by a jet mill, and then the slurry was classified into a mean particle size of 0.2 µm.

(Neodymium Oxide Particles)

Neodymium oxide purchased from Jiangyn Jiahua New Materials and Resources Co., Ltd. was treated with a planetary mill and then classified into a mean particle size of 0.4 µm.

(Lanthanum Oxide Particles)

Lanthanum oxide purchased from Jiangyn Jiahua New Materials and Resources Co., Ltd. was treated with a planetary mill and then classified into a mean particle size of 0.2 µm.

(Praseodymium Oxide Particles)

Praseodymium oxide purchased from Jiangyn Jiahua New Materials and Resources Co., Ltd. was treated with a planetary mill and then classified into a mean particle size of 0.3 µm.

($CeLa_2O_3F_3$ Particles)

Rare earth carbonate concentrate purchased from INNER MONGOLIA BAOTOU STEEL RARE-EARTH HI-TEC was ground, partially fluorinated, dry and fired to obtain a rare earth compound containing $CeLa_2O_3F_3$, and it was treated with a planetary mill and classified into a mean particle size of 0.2 µm.

The purity of the rare earth compound in the abrasive grains used was at least 99.9%.

(Polishing Speed)

It was obtained from the difference in thickness of the interlayer insulating film between before and after polishing for 1 minutes.

EXAMPLE 1

(Preparation of Polishing Compound)

$La_2O_3$ (mean particle size: 0.2 µm) and ion-exchanged water were mixed to prepare a polishing compound containing 2.0% of $La_2O_3$ by using an ultrasonic generator manufactured by NIHON SEIKI KAISHA LTD., Ultrasonic Generator MODEL RUS-600C.

Using this polishing compound, the surface of the interlayer insulating film made of a Black Diamond film formed on the above multilayered product was polished under the following polishing conditions.

Polishing machine: Polishing machine Mirra manufactured by Applied Materials, Inc.

Polishing pad: IC-1400 K-Grooved (concentric groove)

Polishing compound supply amount: 200 mL/min (corresponding to 0.1 mL/(min×cm$^2$))

Polishing time: 1 minute

Polishing pressure: $1.38 \times 10^4$ Pa

Number of revolutions of polishing pad: Head 57 revolutions/min (rpm), platen 63 rpm.

The polishing speed per time in polishing under the above conditions was measured. The result is shown in Table 2.

The polished multilayered product was washed with running ion-exchanged water and then dried. No defects such as cracks, scratches or film peeling were found.

EXAMPLE 2

Evaluation was carried out in the same manner as in Example 1 except that a polishing compound having the following proportion was used instead of the polishing compound of Example 1. The result is shown in Table 2. No defects such as cracks, scratches or film peeling were found.

$Nd_2O_3$ (mean particle size: 0.4 µm): 2.0%

Ion-exchanged water: The rest

EXAMPLE 3

$CeLa_2O_3F_3$ (mean particle size: 0.2 µm) and ion-exchanged water were mixed to prepare a polishing compound containing 1.0% of $CeLa_2O_3F_3$ by using the same ultrasonic generator as in Example 1.

Using this polishing compound, the surface of the same interlayer insulating film as in Example 1 formed on the above multilayered product was polished by the following method.

Polishing machine: Compact size desk lapping machine NF-300 manufactured by Nano Factor Co., Ltd.

Polishing pad: IC-1400 K-Grooved (concentric groove) Polishing compound supply amount: 70 mL/min (corresponding to 0.1 mL/(min×cm$^2$)) Polishing time: 1 minute Polishing pressure: $2.76 \times 10^4$ Pa Number of revolutions of polishing pad: Head 97 rpm, platen 103 rpm.

The polishing speed per time in polishing under the above conditions was measured. The result is shown in Table 3.

The polished multilayered product was washed with running ion-exchanged water and then dried. No defects such as cracks, scratches or film peeling were found.

EXAMPLE 4

Evaluation was carried out in the same manner as in Example 1 except that a polishing compound having the following proportion was used instead of the polishing compound of Example 1. The result is shown in Table 2.

Cerium oxide (mean particle size: 0.2 µm): 1.0%

Ion-exchanged water: The rest

EXAMPLE 5

Evaluation was carried out in the same manner as in Example 3 except that a polishing compound having the following proportion was used instead of the polishing compound of Example 3. The result is shown in Table 3.

Cerium oxide (mean particle size: 0.2 µm): 1.0%

Ion-exchanged water: The rest

EXAMPLE 6

Evaluation was carried out in the same manner as in Example 1 except that a polishing compound having the following proportion was used instead of the polishing compound of Example 1. The result is shown in Table 2.

$SiO_2$ (mean particle size: 0.2 µm): 12.5%

Ion-exchanged water: The rest

EXAMPLE 7

Evaluation was carried out in the same manner as in Example 1 except that a polishing compound having the following proportion was used instead of the polishing compound of Example 1. The result is shown in Table 2.
α-Al$_2$O$_3$ (mean particle size: 0.2 μm): 1.0%
Ion-exchanged water: The rest

EXAMPLE 8

Evaluation was carried out in the same manner as in Example 3 except that a polishing compound having the following proportion was used instead of the polishing compound of Example 3. The result is shown in Table 3. No defects such as cracks, scratches or film peeling were found.
Nd$_2$O$_3$ (mean particle size: 0.4 μm): 1.0%
Ion-exchanged water: The rest

EXAMPLE 9

Cerium oxide particles (mean particle size: 0.2 μm), La$_2$O$_3$ particles (mean particle size: 0.2 μm) and ion-exchanged water were mixed to prepare a polishing compound containing 1.0% of the cerium oxide particles and 1.0% of the La$_2$O$_3$ particles by using an ultrasonic generator manufactured by NIHON SEIKI KAISHA LTD., Ultrasonic Generator MODEL RUS-600C.

Using the polishing compound, the surface of the interlayer insulating film made of a Black Diamond film formed on the above multilayered product was polished.

The polishing speed per time in polishing under the above conditions was measured. The result is shown in Table 2.

The polished multilayered product was washed with running ion-exchanged water and then dried. No defects such as cracks, scratches or film peeling were found.

EXAMPLE 10

Evaluation was carried out in the same manner as in Example 9 except that a polishing compound having the following proportion was used instead of the polishing compound of Example 9. The result is shown in Table 2. No defects such as cracks, scratches or film peeling were found.
Cerium oxide particles (mean particle size: 0.2 μm): 0.5%
Nd$_2$O$_3$ particles (mean particle size: 0.4 μm): 1.0% Ion-exchanged water: The rest

EXAMPLE 11

Cerium oxide particles (mean particle size: 0.2 μm), Pr$_6$O$_{11}$ particles (mean particle size: 0.3 μm) and ion-exchanged water were mixed to prepare a polishing compound containing 0.5% of the cerium oxide particles and 0.5% of the Pr$_6$O$_{11}$ particles by using the same ultrasonic generator as in Example 9.

Using this polishing compound, the surface of the same interlayer insulating film as in Example 9 formed on the multilayered product was polished under the same polishing conditions as in Example 3.

The polishing speed per time in polishing under the above conditions was measured. The result is shown in Table 3.

The polished multilayered product was washed with running ion-exchanged water and then dried. No defects such as cracks, scratches or film peeling were found.

EXAMPLE 12

Evaluation was carried out in the same manner as in Example 9 except that a polishing compound having the following proportion was used instead of the polishing compound of Example 9. The result is shown in Table 2.
Cerium oxide particles (mean particle size: 0.2 μm): 1.0%
Ion-exchanged water: The rest

EXAMPLE 13

Evaluation was carried out in the same manner as in Example 11 except that a polishing compound having the following proportion was used instead of the polishing compound of Example 11. The result is shown in Table 3.
Cerium oxide particles (mean particle size: 0.2 μm): 1.0%
Ion-exchanged water: The rest

EXAMPLE 14

Evaluation was carried out in the same manner as in Example 9 except that a polishing compound having the following proportion was used instead of the polishing compound of Example 9. The result is shown in Table 2.
SiO$_2$ particles (mean particle size: 0.2 μm): 12.5%
Ion-exchanged water: The rest

EXAMPLE 15

Evaluation was carried out in the same manner as in Example 9 except that a polishing compound having the following proportion was used instead of the polishing compound of Example 9. The result is shown in Table 2.
α-Al$_2$O$_3$ particles (mean particle size: 0.2 μm): 1.0%
Ion-exchanged water: The rest

EXAMPLE 16

Evaluation was carried out in the same manner as in Example 9 except that cerium oxide particles (mean particle size: 0.2 μm) and La$_2$O$_3$ particles (mean particle size: 0.2 μm) in the proportion (mass ratio) as shown in Table 4 were used instead of the polishing compound of Example 9. The result is shown in Table 4.

EXAMPLE 17

Evaluation was carried out in the same manner as in Example 9 except that cerium oxide particles (mean particle size: 0.2 μm) and Nd$_2$O$_3$ particles (mean particle size: 0.4 μm) in the proportion (mass ratio) as shown in Table 5 were used instead of the polishing compound of Example 9. The result is shown in Table 5.

TABLE 1

Counts of C and Si per Ar sputtering time

| Ar sputtering time (min) | Count of C (cps) | Count of Si (cps) | C/Si atomic ratio |
|---|---|---|---|
| 0 | 40704 | 21414 | 1.65 |
| 10 | 44424 | 21636 | 1.79 |
| 20 | 44884 | 20334 | 1.92 |

TABLE 2

Polishing speed under various conditions

| Ex. | Polishing speed (nm/min) |
|---|---|
| 1 | $1731 \times 10^{-1}$ |
| 2 | $1648 \times 10^{-1}$ |
| 4 | $305 \times 10^{-1}$ |

TABLE 2-continued

Polishing speed under various conditions

| Ex. | Polishing speed (nm/min) |
|---|---|
| 6 | $146 \times 10^{-1}$ |
| 7 | $256 \times 10^{-1}$ |
| 9 | $2740 \times 10^{-1}$ |
| 10 | $1946 \times 10^{-1}$ |
| 12 | $305 \times 10^{-1}$ |
| 14 | $146 \times 10^{-1}$ |
| 15 | $256 \times 10^{-1}$ |

TABLE 3

Polishing speed under various conditions

| Ex. | Polishing speed (nm/min) |
|---|---|
| 3 | $2725 \times 10^{-1}$ |
| 5 | $847 \times 10^{-1}$ |
| 8 | $1168 \times 10^{-1}$ |
| 11 | $3698 \times 10^{-1}$ |
| 13 | $847 \times 10^{-1}$ |

TABLE 4

Proportion of $La_2O_3$ and cerium oxide and polishing speed

| Amount of cerium oxide (mass %)* | $La_2O_3$ (mass %)* | $La_2O_3$/(cerium oxide + $La_2O_3$) (mass ratio) | Polishing speed (nm/min) |
|---|---|---|---|
| 2.0 | 0.0 | 0 | $411 \times 10^{-1}$ |
| 1.0 | 0.5 | 0.33 | $1864 \times 10^{-1}$ |
| 1.0 | 1.0 | 0.5 | $2740 \times 10^{-1}$ |
| 0.5 | 1.0 | 0.67 | $2320 \times 10^{-1}$ |
| 0.0 | 2.0 | 1.0 | $1731 \times 10^{-1}$ |

*Concentration in polishing compound

TABLE 5

Proportion of $Nd_2O_3$ and cerium oxide and polishing speed

| Amount of cerium oxide (mass %)* | $Nd_2O_3$ (mass %)* | $Nd_2O_3$/(cerium oxide + $Nd_2O_3$) (mass ratio) | Polishing speed (nm/min) |
|---|---|---|---|
| 2.0 | 0.0 | 0 | $411 \times 10^{-1}$ |
| 1.0 | 0.5 | 0.33 | $840 \times 10^{-1}$ |
| 1.0 | 1.0 | 0.5 | $1664 \times 10^{-1}$ |
| 0.5 | 1.0 | 0.67 | $1946 \times 10^{-1}$ |
| 0.0 | 2.0 | 1.0 | $1505 \times 10^{-1}$ |

*Concentration in polishing compound

INDUSTRIAL APPLICABILITY

The present invention provides a polishing compound for an insulating film for a semiconductor integrated circuit, which effectively planarizes an insulating film comprising an organic silicon material having a C—Si bond and a Si—O bond, formed on a semiconductor integrated circuit, and which can provide a high quality polished surface which is free from or has reduced defects such as cracks, scratches or film peeling, in a process for producing a semiconductor integrated circuit.

Further, it provides a method for producing a semiconductor integrated circuit, which makes it possible to produce a semiconductor integrated circuit with an insulating film having a low dielectric constant and excellent in surface flatness, with high yield with good productivity.

The entire disclosures of Japanese Patent Application No. 2002-261965 filed on Sep. 6, 2002 and Japanese Patent Application No. 2002-261964 filed on Sep. 6, 2002 including specifications, claims, drawings and summaries are incorporated herein by reference in their entireties.

What is claimed is:

1. A polishing compound for polishing an insulating film comprising an organic silicon material having a C—Si bond and a Si—O bond, to be used for a semiconductor integrated circuit, which comprises
water, and
abrasive particles of at least one specific rare earth compound selected from the group consisting of a rare earth hydroxide, a rare earth fluoride, a rare earth oxyfluoride, a rare earth oxide except cerium oxide, and a composite compound thereof, and
cerium oxide particles,
wherein the proportion of said specific rare earth compound in the abrasive particles is higher than 99 mass%.

2. The polishing compound according to claim 1, wherein the specific rare earth compound is at least one rare earth compound selected from the group consisting of $La_2O_3$, $La(OH)_3$, $Nd_2O_3$, $Nd(OH)_3$, $Pr_6O_{11}$, $Pr(OH)_3$, and $CeLa_2O_3$.

3. A method for producing a semiconductor integrated circuit, comprising polishing an insulating film comprising an organic silicon material having a C—Si bond and a Si—O bond, with a polishing compound according to claim 1.

4. The method for producing a semiconductor integrated circuit according to claim 3, wherein the specific rare earth compound is at least one rare earth compound selected from the group consisting of $La_2O_3$, $La(OH)_3$, $Nd_2O_3$, $Nd(OH)_3$, $Pr_6O_{11}$, $Pr(OH)_3$, and $CeLa_2O_3F_3$.

5. The method for producing a semiconductor integrated circuit according to claim 3, wherein the organic silicon material having a C—Si bond and a Si—O bond has a Si—CH$_3$ bond, has a relative dielectric constant within a range of from 1.0 to 3.5, and has an atomic ratio of C to Si within a range of from 0.25 to 3.

6. The method for producing a semiconductor integrated circuit according to claim 5, wherein the insulating film is to cover a copper wiring layer.

7. The method according to claim 3, wherein the specific rare earth compound is a rare earth hydroxide.

8. The method according to claim 3, wherein the specific rare earth compound is a rare earth fluoride.

9. The method according to claim 3, wherein the specific rare earth compound is a rare earth oxyfluoride.

10. The method according to claim 3, wherein the specific rare earth compound is said composite compound thereof.

11. The polishing compound according to claim 1, wherein the specific rare earth compound is a rare earth hydroxide.

12. The polishing compound according to claim 1, wherein the specific rare earth compound is a rare earth fluoride.

13. The polishing compound according to claim 1, wherein the specific rare earth compound is a rare earth oxyfluoride.

14. The polishing compound according to claim 1, wherein the specific rare earth compound is said composite compound thereof.

* * * * *